United States Patent [19]

Back

[11] Patent Number: 5,365,404
[45] Date of Patent: Nov. 15, 1994

[54] JACK-TYPE SEMICONDUCTOR INTEGRATED CIRCUIT PACKAGES

[75] Inventor: Seung Dae Back, Choongcheongbook-Do, Rep. of Korea

[73] Assignee: Goldstar Electron Co., Ltd., Choongchungbook-Do, Rep. of Korea

[21] Appl. No.: 962,878

[22] Filed: Oct. 19, 1992

[30] Foreign Application Priority Data

Nov. 14, 1991 [KR] Rep. of Korea ............... 20242/1991

[51] Int. Cl.⁵ ............................................. H05K 7/02
[52] U.S. Cl. ................... 361/760; 361/767; 361/785; 174/52.4; 257/787
[58] Field of Search ............... 361/399, 400, 402, 403, 361/409, 413, 752, 760, 761, 767, 785; 174/52.2, 52.3, 52.4; 257/687, 693, 786, 787, 784; 439/68

[56] References Cited

U.S. PATENT DOCUMENTS

| | | | |
|---|---|---|---|
| 4,331,371 | 5/1982 | Ichimura et al. | 339/74 R |
| 4,340,266 | 7/1982 | Grovender | 339/17 CF |
| 4,598,965 | 7/1986 | Bricaud et al. | 339/75 MP |
| 4,936,783 | 6/1990 | Petersen | 439/70 |
| 5,180,976 | 1/1993 | Van Loan et al. | 324/158 F |

*Primary Examiner*—Leo P. Picard
*Assistant Examiner*—Young S. Whang
*Attorney, Agent, or Firm*—Scully, Scott, Murphy & Presser

[57] ABSTRACT

A jack-type semiconductor integrated circuit package with a jack-type connector instead of conventional leads. This package comprises a semiconductor chip which is provided with a plurality of bond pads, a jack housing which is adapted to electrically connect the package to a printed circuit board (PCB) and connected to a plurality of connection pins, a resin film which electrically connects the bond pads of the semiconductor chip to the connection pins of the jack housing, bonds the jack housing to the semiconductor chip and contains a plurality of conductive wires and a sealing resin housing which seals both the semiconductor chip and the jack housing and is formed in a predetermined shape by a molding process. The present package makes the operational reliability be improved and is especially suited for providing a high density IC memory chip package.

8 Claims, 4 Drawing Sheets

JACK-TYPE SEMICONDUCTOR INTEGRATED CIRCUIT PACKAGES

BACKGROUND OF THE INVENTION

1. Field of the Invention

The present invention relates in general to a novel semiconductor package structure, and more particularly to a jack-type semiconductor integrated circuit (hereinafter, referred to simply as "IC") package which simplifies the preparation process thereof and includes a jack-type connector, which can improve the operational reliability of the package. The present package is especially suited for providing a high density IC memory chip package.

2. Description of the Prior Art

With reference to FIGS. 1A, 1B and 2, FIGS. 1A and 1B show an embodiment of a known lead in board type of semiconductor package, respectively, while FIG. 2 shows an embodiment of a known lead on board type of semiconductor package. These known semiconductor packages regardless of their types are respectively generally prepared by bonding, using a bonding epoxy, a semiconductor chip 10 on a pad 21 of a lead frame 20, the lead frame 20 integrally comprising a plurality of leads 22 and 23 and the pad 21. After the bonding step, the bonded subassembly is hardened. Thereafter, a plurality of inner leads 22, which symmetrically inwardly extend toward both sides of the chip 10, of the lead frame 20 are connected, using a plurality of gold wires 40, to a plurality of connection terminals 11 provided on the chip 10. With the semiconductor chip 10 and the gold wires 40 now subassembled on the lead frame 20, the lead frame 20 is placed between the halves of a mold, preferably a transfer mold, in order to form a plastic housing 50. In this case, the outer leads 23 of the lead frame 20 symmetrically extend outwards from both sides of the plastic housing 50. These extending outer leads 23 are then sequentially processed in continued steps, such as trimming, forming, lead plating and etc., in order to accomplish the preparation process of these known semiconductor IC packages. Here, each of the same reference numerals in the drawings denotes the same element.

In assembling the above semiconductor packages to a printed circuit board (PCB, not shown), the package, in the case of the lead in board type of semiconductor package of which each of the outer leads 23 has a straight terminal as depicted in FIGS. 1A and 1B, is assembled to the PCB by inserting the outer lead terminals into the PCB. Here, the PCB is previously formed with a plurality of pin through holes through which the outer leads 23 of the lead in board type of semiconductor package are to be inserted. Thereafter, in order to complete the assembly process, the outer leads 23 inserted in the pin through holes are then connected to the PCB by soldering in a conventional soldering reservoir.

On the other hand, in the case of the lead on board type of semiconductor package of which each of the outer leads 23 has an outwardly bent terminal as depicted in FIG. 2, the package is assembled to the PCB by locating the package on a desired position of the PCB and soldering the bent terminals of the outer leads 23 to the PCB. Here, the PCB is previously provided with a pattern, on which the bent terminals of the outer leads 23 are to be soldered, prior to soldering the outer leads 23 thereto.

Especially in the case of the lead on board type of semiconductor package shown in FIG. 2, it is known that the space interval between the outer leads 23 is typically maintained at about 1.27 mm and, in this regard, this package has a desired fine pitch structure. Because of such a fine pitch structure, this type of semiconductor package has a relatively smaller volume than that of the lead in board type of semiconductor package, having the same memory capacity, shown in FIGS. 1A and 1B. Additionally, another advantage of this type of package resides in that it permits the resultant circuit assembly to be integrated highly densely since the PCB can be equipped with the packages at its both surfaces.

However, the above semiconductor packages irrespective of their types have a problem in that a minute gap are easily formed at a contact part between the lead frame 20 and the plastic housing 50. In other words, because of difference of the physical properties between the material of the lead frame 20 and the plastic resin material of the housing 50 and, in this regard, the minute gaps are easily formed therebetween due to a difference of the thermal expansion coefficient therebetween caused by variations of temperature.

Typically, it is noted that such minute gaps can be somewhat reduced by reducing the difference of the thermal expansion coefficient and improving the bonding force, both properties between the two members 20 and 50. However, such a problem of the gaps can not be completely overcome since each of the known semiconductor packages has such intrinsic structure that the lead frame 20 extends outwards through the plastic housing 50. In result, humidity may enter the semiconductor package through the minute gaps and this causes the operational reliability of the package to be necessarily deteriorated.

In addition, the known semiconductor packages have a disadvantage in that, due to differences of the linear expansion coefficient between the plastic housing 50, the semiconductor chip 10 and the lead frame 20, there may occur breakage of the semiconductor chip 10, cracking of the inside of the package, separation of the semiconductor chip 10 from the pad 21 and the like, thereby causing the reliability of the package to be further deteriorated. That is, since the plastic resin of the housing 50 has a relative higher linear expansion coefficient of about $14 \times 10^{-6}/K$–$17 \times 10^{-6}/K$, while the semiconductor has a relative lower linear expansion coefficient of about $3 \times 10^{-6}/K$, about 1/5 of that of the plastic resin, the aforementioned mechanical inferiority may occur.

On the other hand, the known semiconductor package has the outer leads 23, which extend outwards through the plastic housing 50 as described above and are adapted to connect the package to the PCB, so that these outer leads 23 are necessarily processed in trimming, wherein the unnecessary parts are cut off from the leads 23, and forming, wherein the leads 23 are bent. In result, in order to prepare the known semiconductor packages, the preparation process is undesirably complicated and several processing devices are required. Furthermore, the minute gaps between the plastic housing 50 and the outer leads 23 easily widen during the aforementioned processes such as trimming and forming and this causes the operational reliability of the package to be deteriorated.

Also, as aforementioned the leads 23 of the lead frame 20 of the known packages are required to not only symmetrically extend outwards from the opposite sides of the plastic housing 50 but also be spaced apart from each other by a predetermined minimal interval for causing the leads 23 to be separated from each other. In this respect, the known packages respectively have a disadvantage in that the relative size of the semiconductor chip with respect to the package size is undesirably small.

SUMMARY OF THE INVENTION

It is, therefore, an object of the present invention to provide a jack-type semiconductor IC package in which the aforementioned disadvantages can be overcome and which has a plurality of pin-type leads for connecting the package to the PCB and, in this respect, is easily connected to and removed from the PCB and improves its operational reliability.

It is another object of the present invention to provide a jack-type semiconductor IC package which increases the size ratio of the semiconductor chip to the size of the package, thereby improving the memory capacity and accomplishing structural compactness.

In an embodiment, the present invention provides a jack-type semiconductor integrated circuit package comprising: a semiconductor chip which is provided with a plurality of bond pads; a jack housing which is adapted to electrically connect the package to a printed circuit board (PCB) and connected to a plurality of connection pins which are arranged in a predetermined pattern; a resin film for electrically connecting the bond pads of the semiconductor chip to the connection pins of the jack housing and bonding the jack housing to the semiconductor chip, said resin film containing a plurality of conductive wires; and a sealing resin housing for sealing both the semiconductor chip and the jack housing, which are bonded to each other by said resin film, said sealing resin housing being formed in a predetermined shape by molding process.

In accordance with the present invention, in order to assemble the present package to the PCB, the PCB is previously provided with a female jack, which corresponds to the male jack or the connection pins of the package, thereafter, the male jack of the package is inserted into the female jack of the PCB. As a result, the package can be easily assembled to and removed from the PCB. The present jack-type semiconductor IC package has no conventional leads which protrude from the package and, in this respect, causes the conventional lead machining process to be removed from tile package preparation process. The present package also removes the minute gaps, which are conventionally formed between the leads and the resin housing, for such a structure, thereby improving the operational reliability against the environmental change.

BRIEF DESCRIPTION OF THE DRAWINGS

The above and other objects, features and other advantages of the present invention will be more clearly understood from the following detailed description taken in conjunction with the accompanying drawings, in which:

FIGS. 1A and 1B are views showing an embodiment of a known lead in board type of semiconductor IC package, respectively, in which:

FIG. 1A is a perspective view; and
FIG. 1B is a cross sectioned view;

DESCRIPTION OF THE PREFERRED EMBODIMENTS

Figure 1A:
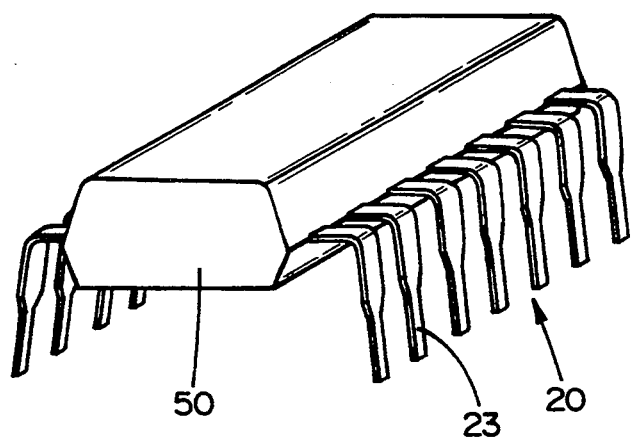
Figure 1B:
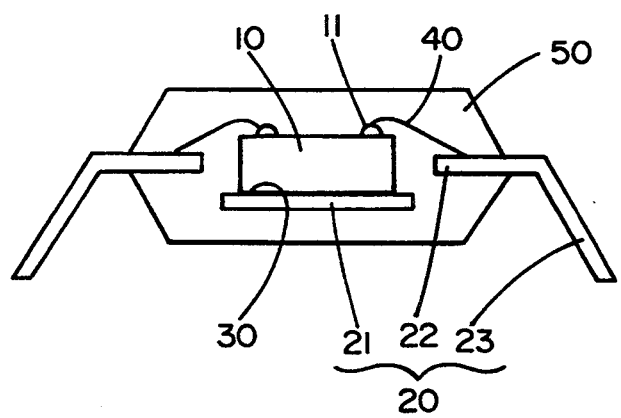
Figure 2:
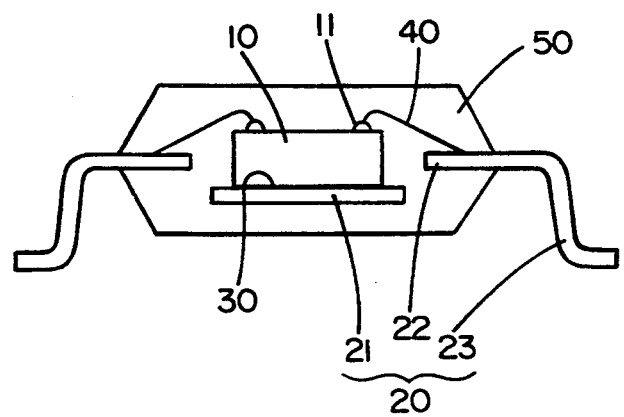
FIG. 2 is a view corresponding to FIG. 1B, but showing an embodiment of a known lead on board type of semiconductor IC package.
Figure 3:
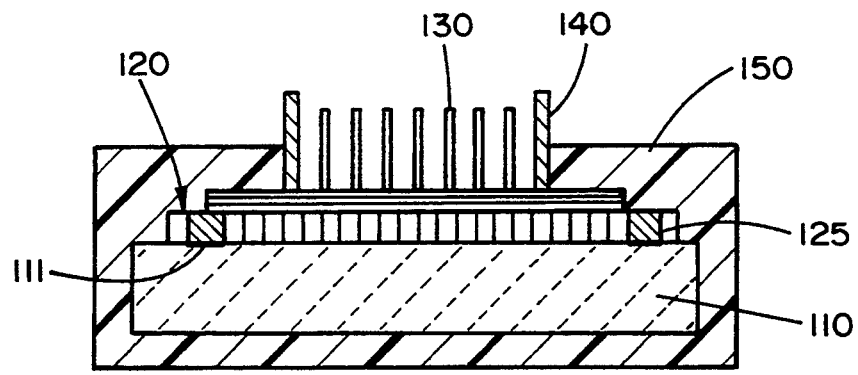
FIG. 3 is a cross sectioned view of an embodiment of a jack-type semiconductor IC package in accordance with the present invention.
Figure 4:
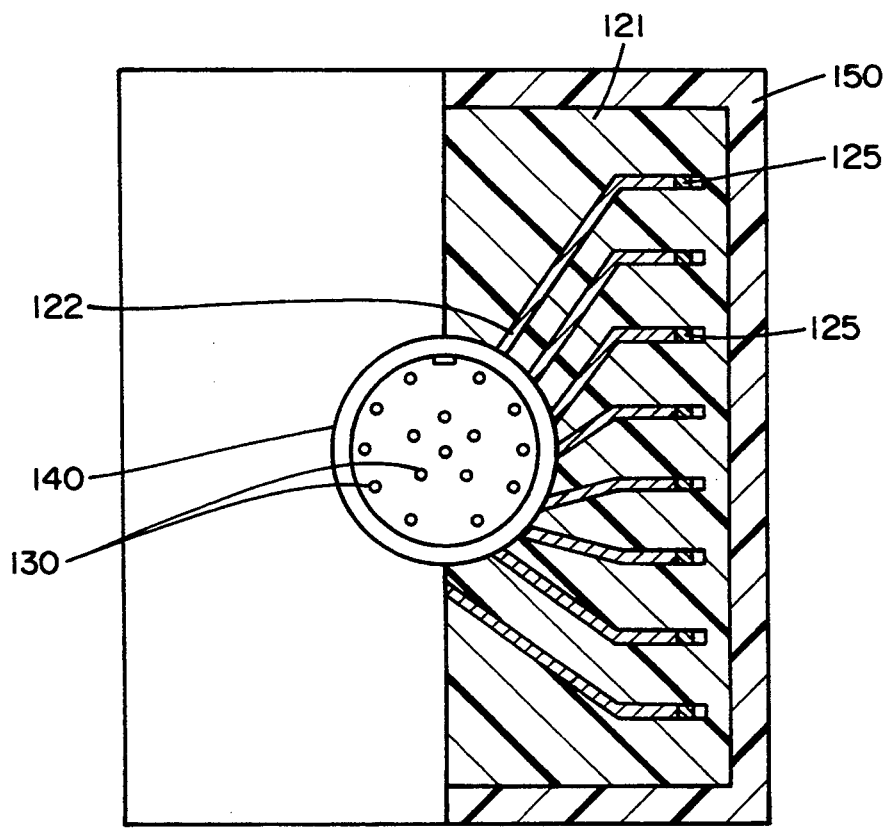
FIG. 4 is a plane sectioned view of the embodiment of FIG. 3.
Figure 5:
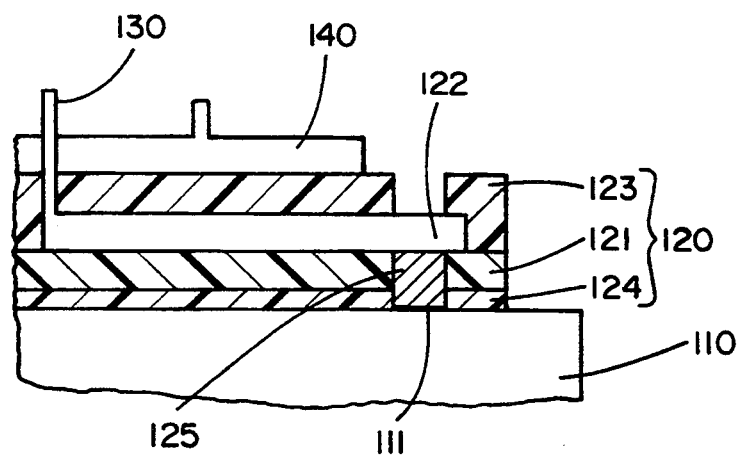
FIG. 5 is a partially enlarged sectioned view of the embodiment of FIG. 3.

As depicted in FIGS. 3 to 5 showing an embodiment of a jack-type semiconductor IC package in accordance with the present invention, this package comprises a semiconductor chip 110 provided thereon with a plurality of bond pads 111, a cylindrical jack housing 140 encircling and connected to a plurality of connection pins 130 vertically arranged in a predetermined pattern. Under the jack housing 140, a resin film 120, containing a plurality of conductive wires 122, is disposed in order to not only electrically connect the bond pads 111 of the semiconductor chip 110 to the connection pins 130 inside the jack housing 140 but also bond the jack housing 140 to the semiconductor chip 110. Additionally, the present package includes a sealing resin housing 150 which is formed in a predetermined shape by molding and seals both the semiconductor chip 110 and the jack housing 140, which are bonded to each other with the bonding medium of the resin film 120.

Here, as depicted in detail in FIG. 5, the resin film 120 comprises a base layer 121, made of polyimide resin, and the plurality of conductive wires 122. Here, these conductive wires 122 are arranged on the base layer 121 so as to electrically connect the bond pads 111 of the semiconductor chip 110 to the connection pins 130 inside the jack housing 140. To the upper surface of the base layer 121, an upper bonding resin layer 123 is applied such that the plurality of conductive wires 122 are covered therewith and insulated from each other thereby. This upper bonding resin layer 123 has an additional role for bonding the conductive wires 122, the base layer 121 to the under surface of the jack housing 140. On the other hand, a lower bonding resin layer 124 is applied to the under surface of the base layer 121 in order to bond the base layer 121 to the semiconductor chip 110. The resin film 120 is also provided with a plurality of conductive bumps 125 each adapted to electrically connect an end of each conductive wire 122 to a corresponding bond pad 111 of the semiconductor chip 110. Each of These conductive bumps 125 vertically penetrates both the lower resin layer 124 and the base layer 121.

Each of the connection pins 130 comprises a metal pin and vertically penetrates both the upper resin layer 123 of the resin film 120 and the bottom of the jack housing 140 in order to be welded to a corresponding conductive wire 122.

In connecting the connection pins 130 to the jack housing 140, each of the connection pins 130 is covered at its lower part with glass or ceramic in order to be surrounded thereby so that it, when fixedly inserted into and connected to the bottom of the jack housing 140, is efficiently insulated from the jack housing 140 and prevents humidity from entering the package through the connection parts. In result, this package provides a desired moisture proof.

Also, the bond pads 111 of the semiconductor chip 110 are metallically connected to the conductive wires 122 of the resin film 120 by the conductive bumps 125. In detail described, the conductive bumps 125 are downwardly provided at the ends of the conductive wires 122 of the resin film 120 and penetrate both the base layer 121 and the lower resin layer 124 in order to come into contact with the bond pads 111 of the semiconductor chip 110. In this case, since the conductive bumps 125 are applied with downward biasing force, each of the conductive bumps 125 is metallically closely connected at its lowermost end to the upper surface of a corresponding bond pad 111 of the chip 110 and, in this respect, the electrical connection of the conductive wires 122 to the bond pads 111 of the semiconductor chip 110 is reliably accomplished.

At this time, there may occur a problem in aligning each conductive wire 122 with a corresponding bond pad 111 of the semiconductor chip 110. However, it is noted that such a problem can be efficiently overcome by bonding the conductive bumps 125 to the bond pads 111 by an ultrasonic or thermosonic process, using an especial bonding equipment such as STB-FA-IL-20 manufactured by Shinkawa Co. of Japan. That is, since the aforementioned bonding equipment has a precise bonding alignment of X,Y table resolution of 2.5 $\mu$m/stem, there occurs no misalignment in aligning the conductive wires 122 with the bonding pads 111 of the chip 110 and this causes the mass production of the present package to have no problem.

In the aforementioned preferred embodiment, the jack housing 140 is embodied in order to be disposed at the lower part of the package. However, this jack housing 140 may be disposed at an upper part instead of the lower part without departing from the scope of the present invention, furthermore, it may be disposed at both the upper and lower parts of the package.

In addition, in this preferred embodiment, the jack-type package is embodied as a male type since it has the plurality of connection pins 130 vertically fixed to the jack housing 140. However, besides such a male type, the present package may be embodied as a female type (not shown) by equipping the jack housing with a plurality of conductive pin insertion holes, instead of the connection pins 130, which are welded to the conductive wires 122. In this case, an insulation material is filled in the space between the pin insertion holes in order to cause the pin insertion holes to be fixed in their positions and insulated from each other.

Figure 6:
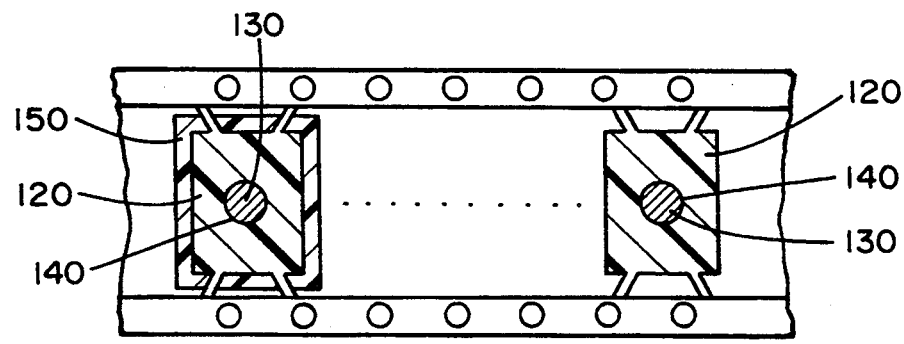
FIG. 6 is a view showing an embodiment of a sequential process for mass-producing the jack-type semiconductor IC package of the present invention.

Turning to FIG. 6 showing an embodiment of a sequential process for mass-producing the jack-type semiconductor IC package of the present invention, the pre-package prior to molding shown at the right side of the drawing moves leftwards. As moving leftwards, the pre-package is processed in the molding process in order to be covered with the sealing resin housing 150, as a result, the resultant package, shown at the left side of this drawing, is obtained. In this regard, it is possible to economically mass-produce the present package.

Figure 7:
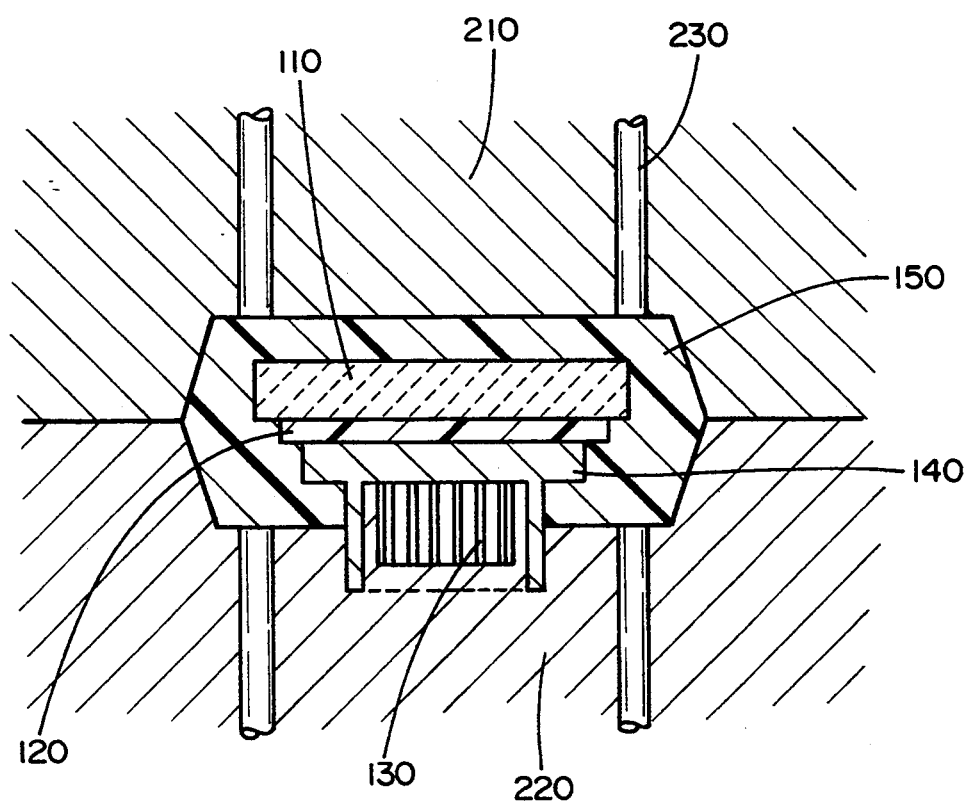
FIG. 7 is a sectioned view showing a molding cavity of an embodiment of a mold for molding the package of the present invention.

FIG. 7 is a sectioned view showing a molding cavity of an embodiment of a mold for molding the jack-type IC package of the present invention. In this drawing, the reference numeral 210 denotes an upper mold die, 220 denotes a lower mold die and 230 denotes an ejector pin.

The present jack-type semiconductor IC package having the aforementioned construction permits its semiconductor chip 110 to not only output or be applied with electric signals through, for an embodiment, the connection pins 130 of the jack housing 140 but also be supplied with electric power therethrough. In addition, the connection of this package to the PCB is easily accomplished by inserting the connection pins 130 of the jack housing 140 into the female jack of the PCB or, in the case of another embodiment having the pin insertion holes as aforementioned, receiving the pins or the male jack of the PCB in the pin insertion holes of the jack housing 140, thereby causing the process for assembling the package to the PCB to be simply carried out.

As described above, the present invention provides a jack-type semiconductor IC package which removes the leads, which conventionally symmetrically extend outwards from both sides of the package, therefrom and this causes the lead machining steps, such as the trimming, the forming and the lead plating steps, to be efficiently removed from the package preparation process. This package also easily accomplishes its connection to the PCB by, for an embodiment, simply inserting its connection pins of the jack housing into the female jack of the PCB, thereby the degree of integration to be improved in comparison with the prior embodiments having the leads. Additionally, since this package has no lead, it has no minute gap which is conventionally formed between the lead and the resin housing of the package and, as a result, improves its resistance against the environment.

Also, since present package can be equipped with a semiconductor chip having a relatively larger size of at least 90% of the package size, it improves its memory capacity in comparison with the prior embodiments, each of which is conventionally equipped with a semiconductor chip having a relatively smaller size of about 65–80% of the package size. Moreover, when the present package, which has been already connected to the PCB, turns out to have an operational problem, it can be easily removed from the PCB and substituted by new one without occurrence of damage of the PCB.

In addition, this package can be easily connected to the PCB by simply inserting its connection pins of the jack housing into the female jack of the PCB as described above so that, differently from the prior embodiments, it is not required to insert the leads into the PCB or be welded to the upper surface of the PCB after locating the leads on the upper surface. As a result, the present package permits the process for assembling the package to the PCB to be simplified. Furthermore, the package is simply assembled to and removed from the PCB.

Although the preferred embodiments of the present invention have been disclosed for illustrative purpose, those skilled in the art will appreciate that various modifications, additions and substitutions are possible, without departing from the scope and spirit of the invention as disclosed in the accompanying claims.

What is claimed is:

1. A jack semiconductor integrated circuit package comprising:

a semiconductor chip, said semiconductor chip being provided with a plurality of bond pads;

jack means for electrically connecting said semiconductor chip, said jack means including a jack housing and a plurality of connection members connected to said jack housing;

a resin film for electrically connecting said bond pads of the semiconductor chip to said connection members of the jack means and bonding the jack means to the semiconductor chip, said resin film containing a plurality of conductive wires; and a sealing resin housing for sealing both the semiconductor chip and the jack means, which are bonded to each other by said resin film.

2. The jack semiconductor integrated circuit package according to claim 1, wherein said jack means is provided at an under surface of the semiconductor package.

3. The jack semiconductor integrated circuit package according to claim 1, wherein said jack means is provided at upper and under surfaces of the semiconductor package.

4. The jack semiconductor integrated circuit package according to claim 1, wherein said jack means is provided at an upper surface of the semi conductor package.

5. The jack semiconductor integrated circuit package according to claim 1, wherein each said connection member of the jack means is a connection pin.

6. The jack semiconductor integrated circuit package according to claim 5, wherein said connection pin comprises a metal pin and penetrates the bottom of the jack housing in order to be welded to an end of the conductive wire.

7. The jack semiconductor integrated circuit package according to claim 1, wherein said resin film comprises:

a base layer;

said plurality of conductive wires being arranged on said base layer so as to electrically connect the bond pads of the semiconductor chip to the connection members of the jack means;

an upper bonding resin layer which is applied to the upper surface of the base layer so as to cause the plurality of conductive wires to be covered therewith and insulated from each other thereby, said upper bonding resin layer bonding said resin film to the under surface of the jack housing;

a lower bonding resin layer which is applied to the under surface of the base layer in order to bond the resin film to the semiconductor chip; and a plurality of conductive bumps for metallically connecting ends of said conductive wires to the bond pads of the semiconductor chip.

8. The jack semiconductor integrated circuit package according to claim 7, wherein each said conductive bump is aligned with each corresponding bond pad of the semiconductor chip in order to come into contact therewith and metallically closely connected at its lowermost end to the upper surface of said corresponding bond pad by downward biasing force which is applied to the conductive bump.

* * * * *